(12) United States Patent
Roth

(10) Patent No.: US 7,026,186 B2
(45) Date of Patent: Apr. 11, 2006

(54) METHOD FOR PRODUCING POLYMER-FREE AREA ON A SUBSTRATE

(75) Inventor: Wolfgang Roth, Uttenreuth (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 114 days.

(21) Appl. No.: 10/481,848

(22) PCT Filed: Jun. 17, 2002

(86) PCT No.: PCT/DE02/02205

§ 371 (c)(1),
(2), (4) Date: Dec. 22, 2003

(87) PCT Pub. No.: WO03/003481

PCT Pub. Date: Jan. 9, 2003

(65) Prior Publication Data

US 2004/0171255 A1     Sep. 2, 2004

(30) Foreign Application Priority Data

Jun. 27, 2001  (DE) ................................ 101 30 992

(51) Int. Cl.
  *H01L 51/40*  (2006.01)

(52) U.S. Cl. .............................. 438/99; 438/82; 257/40
(58) Field of Classification Search .................. 438/99, 438/82, 455, 458, 463; 257/40
See application file for complete search history.

(56) References Cited

FOREIGN PATENT DOCUMENTS

| JP | 11-307246 | 9/1998 |
| JP | 10-261486 | 11/1999 |
| WO | WO 01/18886 A2 | 3/2001 |

OTHER PUBLICATIONS

Vincken, Marianne , Phillips Journal of Research, vol. 51 No. 4, 1998, pp. 461, 463-465, 467-477, 479-493, 495-525, 527-533.

*Primary Examiner*—Bradley K. Smith
(74) *Attorney, Agent, or Firm*—Fish & Richardson P.C.

(57) ABSTRACT

The invention relates to a method for producing a polymer-free area, characterized by applying at least one peelable layer to the substrate, and/or to one or more polymer layer(s) situated on the substrate, in those areas where a polymer-free area is formed on the substrate by removing the peelable layer. The invention thus provides a method for producing polymer-free bonding areas or, by placing a diode-protecting cap on the polymer-free area of the substrate, a hermetically sealed connection between the substrate and the diode-protecting cap.

25 Claims, 1 Drawing Sheet

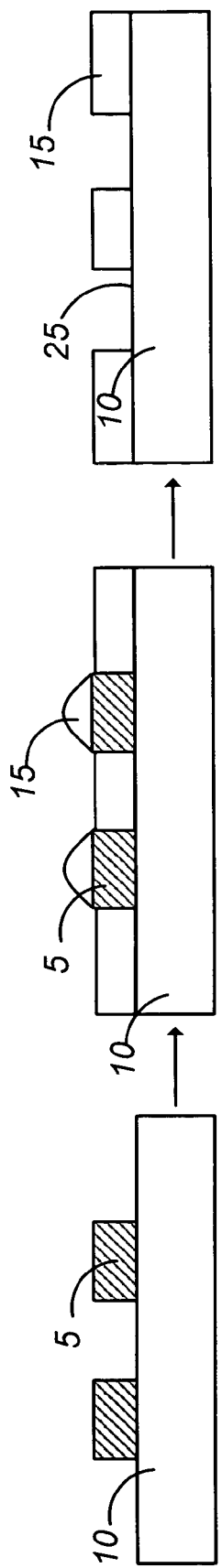
FIG_1
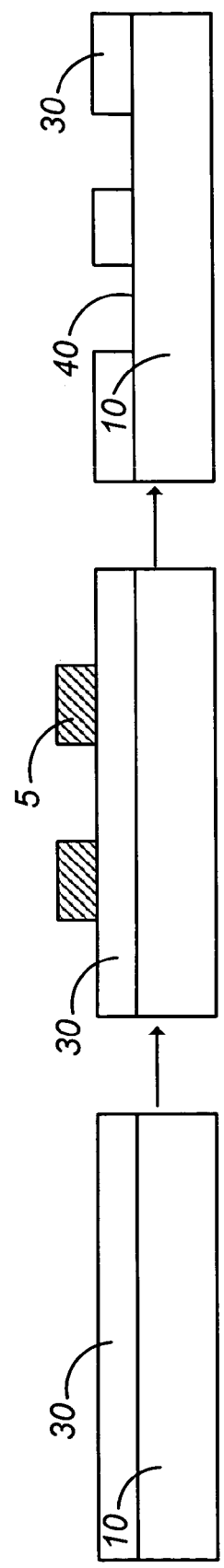
FIG_2

METHOD FOR PRODUCING POLYMER-FREE AREA ON A SUBSTRATE

The invention relates to a method for producing a polymer-free area on a substrate, the use of a peelable layer to produce polymer-free areas on a substrate as well as a product manufactured according to this method.

Numerous methods for producing organic light-emitting diodes (OLEDS) are known from the related art. For example, methods and suitable materials for producing organic light-emitting diodes (OLEDs) are described in *Philips Journal of Research*, Vol. 51, No. 4,461 (1998).

Conventional OLEDs are made up of a plurality of organic polymer layers that are situated on a substrate, glass, for example. In order to ensure an adequate life of such OLEDs, a hermetically sealed encapsulation of the OLED is required because calcium in particular, but also the polymers, react with oxygen and water so that signs of degradation frequently occur in customary OLEDs, which significantly reduce the life of such OLEDs.

In the related art, the individual polymer layers are applied to the diode using a spin coating process by distributing polymer solutions homogeneously over the entire substrate surface. In the last procedural step, a glass cap is cemented to the topmost polymer layer situated on the substrate as a protection. However, the bond of polymer layers to glass is not adequate to ensure a permanent cementing of the glass cap. In the least favorable case, the polymer layer acts as a separating agent to a certain degree, making it impossible to cement the glass cap onto the polymer layer.

Another disadvantage is that the polymer layers form undesirable diffusion paths for water and oxygen because they are located in the glue joint of the glass cap. Finally, polymers can be solubilized by adhesive, as a result of which the curing reaction of the adhesive may be adversely affected.

If, as an alternative to this, the polymer layers are removed mechanically by scraping or are ablated at the appropriate locations on the substrate using laser radiation to produce a glass-glass connection between the glass cap and the glass substrate, this results in the production of particles that can damage the OLED. Moreover, laser ablation is too slow and too costly for industrial applications with high throughput.

SUMMARY

The object of the present invention is to overcome the disadvantages in the related art and to provide a method that makes hermetically sealed packaging of a diode possible in a reproducible manner.

The object of the present invention is achieved by a method through which a polymer-free area is produced on a substrate, at least one peelable layer being applied to the substrate and/or to a polymer layer situated on the substrate at the places at which a polymer-free area is formed by removing the peelable layer.

XPS studies show that, with the method of the present invention, removing the peelable layer creates residue-free, polymer-free areas.

Applying a diode-protective cap on the polymer-free area of the substrate makes it possible to form a hermetically sealed connection, preferably a hermetically sealed glass-glass connection, between the substrate and a diode-protective cap. According to the present invention, it is also possible to place a plurality of diodes (=displays) under one diode-protective cap. The components may be individualized after the encapsulation, i.e., after joining the protective cap or cover to the substrate.

The hermetically sealed connection of the diode-protective cap to the substrate may be produced physically and/or chemically using adhesive. Preferred adhesives include, for example, light curing epoxy resins. They may be applied by dispensing or screen printing.

The diodes hermetically encapsulated according to the present invention, such as OLEDs, have high stability in storage, and pass 85/85 tests in a reproducible manner, i.e., storage at 85% relative humidity and a temperature of 85° C.

In addition, it is possible to produce polymer-free bonding areas on the substrate, a diode substrate, for example, using the method of the present invention by applying the peelable layer at the places on the diode substrate where bonding takes place.

The substrate and the diode-protective cap are preferably made of glass, such as soda-lime glass, ceramic and/or polymer. It is preferred that the diode-protective cap and the substrate have identical coefficients of expansion.

The following combinations are preferred:

| Substrate | Diode-protective cap |
| --- | --- |
| Glass | Glass |
| Glass | Substrate-polymer |
| Substrate-polymer | Glass |
| Substrate-polymer | Substrate-polymer |

Films in particular, preferably made from the materials named above, may be used for the diode-protective cap and/or the substrate. Suitable substrate-polymer films preferably include polyethylene terephthalate, polyethylene, polyether sulfone and/or polyether ketone. The substrate polymers in this case are not included in the term "polymer-free," which is produced by pulling off the peelable layer.

The thickness of the substrate and of the diode-protective cap customarily ranges between 0.5 mm–2 mm. However, it may also be <0.5 mm or >2 mm.

Preferably the area of the substrate is in the range 5×5 mm$^2$–150×150 mm$^2$. However, it may also be <5×5 mm$^2$ or >150×150 mm$^2$. The protective cap may cover the substrate completely or incompletely.

Customarily, the substrate has an anode, preferably an indium tin oxide anode on at least one surface side and the light-emitting layer has a cathode, preferably a Ca cathode.

The peelable layer may be used in different ways. In one case, it may be used, for example, as a protective layer, i.e., corresponding substrate places at which the peelable layer is present, are not covered by the polymer during the spin coating and/or the underlying polymer layer(s) is/are removed when the peelable layer is pulled off. The peelable layer may also be used to pull off a polymer layer or layers located below it along with it. To this end, it is applied to the polymer layer at the appropriate places or areas to be removed. The peelable layer is distinguished in that the polymer component to be removed bonds to it better than to the substrate/the protective cap from which it is to be removed.

The peelable layer(s) may be applied by sputtering, by brushing, using a dispenser or by screen printing, the areas on the substrate onto which the peelable layer is to be applied preferably being defined using a template.

The peelable layer may be formed from a water-based polymer dispersion and/or from an organic polymer solution, the peelable layer preferably being based on a rubber including gutta percha, nitrile rubber, polyisoprene, polybutadiene and/or polyisobutylene. After drying on a substrate, these dispersions or solutions produce an elastic film, which may be pulled off the substrate surface in a simple manner without breaking down or tearing.

The peelable layer is customarily dried in a temperature range of 20° C.–100° C.

The thickness of the peelable layer is preferably ≦1 μm–≧100 μm, preferably 5 μm–80 μm, more preferably 10 μm–60 μm and still more preferably 20 μm–50 μm. The peelable layer may be removed by pulling off and/or by vacuum, for example, using a vacuum sealing lip either in its entirety or only in part.

The polymer layer(s), which according to the present invention, may be removed at least in areas using the peelable layer, may be one or a plurality of diode layer(s), a hole conduction layer in particular of PEDOT or polyaniline, for example, an emitter layer of polyfluorene or a poly(p-phenylenevinylene) derivative and/or an electron conduction layer of polybenzoxazole, for example.

A preferred embodiment of the present invention relates to a hermetically sealed encapsulated diode having a protective cap, preferably an OLED, on a substrate, which may be manufactured according to the method of the present invention.

Another preferred embodiment has a substrate on which a diode having an ITO anode, an HTL layer, an emitter layer, an ETL layer and a cathode is situated, the diode being hermetically encapsulated on the substrate.

Preferred embodiments of the method of the present invention according to the preamble of Claim 1 will be explained below in greater detail with reference to FIGS. 1 and 2.

DESCRIPTION OF DRAWINGS

FIG. 1 shows a substrate having a peelable layer and a spin coating layer.

FIG. 2 shows a substrate having a polymer layer and a peelable layer applied to it.

The invention will be explained in greater detail with reference to the following examples 1–2.

EXAMPLE 1

A peelable frame as a protective frame for the substrate surface is produced on a glass substrate 10 on which the OLED is built up, at the places where a glass-glass sealing connection is to be produced later. Preferably a latex protective coating is used for this purpose. The application is performed manually using a template. The thickness of the peelable layer 5 is selected in such a way that a subsequent spin coating process is not adversely affected. Advantageously the layer thickness is in the range from 10–100 μm. In the case that glass protective caps are cemented, the cap geometry determines the geometry of the peelable frame 15. In the present case, it is a rectangle of edge lengths 20×40 mm and a width of 2 mm. After the peelable layer 5 has dried, which may take place at room temperature or a higher temperature, a PEDOT solution 15 is applied by spin coating at 2000 rps for 20 seconds. After briefly drying this layer 15, the peelable layer 5 is pulled off. As a result, a polymer-free frame 25 having an edge length of 20×40 mm and a width of 2 mm having sharp edges and corners is obtained on the glass substrate 10 (see FIG. 1). The PEDOT layer 15 is now dried at 200° C. for 2 minutes.

EXAMPLE 2

A polyfluorene layer 30 is applied to the substrate 10 obtained according to example 1 by spin coating from a xylene solution at 2000 rps for 20 seconds, for example. After the polymer layer 30 has started to dry, the peelable frame 5 again applied congruently to the PEDOT-free area of the substrate of the peelable frame. A latex protective coating is used for this purpose. The application is performed by hand, for example, using a template. After the peelable frame 5 has dried at room temperature or at a higher temperature, the peelable frame 5 is pulled off. In doing so, the polyfluorene layer 30 located under it is pulled off with it because of the bond to the peelable frame 5. As a result, a polymer-free frame 40 having an edge length of 20×40 mm and a width of 2 mm having sharp edges and corners is obtained. In the area of this frame 40, it is now possible to produce a hermetically sealed glass-glass connection, in the present case by cementing a glass protective cap using a light curing epoxy resin based adhesive. Before cementing, a calcium layer of a thickness of 100 μm is applied as a cathode by vacuum metallization.

What is claimed is:

1. A method for producing a polymer-free area on a substrate, comprising:
   forming a first layer and a second layer on a substrate, the first layer being a peelable layer and the second layer being a polymer layer including a first polymer material;
   removing the peelable layer so that a portion of the polymer layer is also removed, wherein the portion of the polymer layer is adjacent to the peelable layer and removing the peelable layer forms a polymer-free area on the substrate, and
   mounting a diode-protective cap on the polymer-free area of the substrate so that the diode-protective cap is hermetically sealed to the substrate.

2. The method of claim 1, wherein:
   the portion of the polymer layer is in contact with the peelable layer.

3. The method of claim 1, wherein:
   the polymer layer includes at least one of a diode layer, a hole conduction layer, an electron conduction layer or an emitter layer.

4. The method of claim 1, wherein:
   the diode-protective cap is bonded to the substrate with an adhesive.

5. The method of claim 4, wherein:
   the adhesive includes a light curing epoxy resin.

6. The method of claim 1 wherein:
   the diode-protective cap includes glass.

7. The method of claim 1 wherein:
   the substrate includes a second polymer material and the diode-protective cap includes the second polymer material.

8. The method of claim 1, wherein:
   the diode-protective cap and the substrate have identical coefficients of expansion.

9. The method of claim 1, wherein:
   a plurality of diodes is situated under a single diode-protective cap.

10. The method of claim 1, wherein:
    forming the first layer includes dispensing or screen printing.

11. The method of claim 1, wherein:
    forming the first layer includes spraying or brushing.

12. The method of claim 11, wherein:
forming the first layer includes using a template.

13. The method of claim 1, wherein:
forming the first layer includes applying a water-based polymer dispersion or an organic polymer solution.

14. The method of claim 13, wherein:
the peelable layer includes a material based on gutta percha, nitrile rubber, polyisoprene, polybutadiene or polyisobutylene.

15. The method of claim 1, wherein:
removing the peelable layer includes removing by vacuum.

16. The method of claim 1, wherein:
the peelable layer is formed over the polymer layer.

17. The method of claim 1, wherein:
the polymer layer is formed over the peelable layer.

18. The method of claim 1, wherein:
the substrate includes at least one of polyethylene terephthalate, polyethylene, polyether sulfone or polyether ketone.

19. The method of claim 1, further comprising:
forming a calcium layer on the substrate.

20. The method of claim 1, wherein:
forming the first layer includes applying a peelable layer to a substrate.

21. The method of claim 1, wherein:
the first layer is formed before the second layer is formed.

22. The method of claim 1, wherein:
the second layer is formed before the first layer is formed.

23. A method for producing a polymer-free area on a substrate, comprising:
forming a first layer on a substrate in a first area and forming a second layer on the substrate, the first layer being a peelable layer and the second layer being a polymer layer of a first polymer material;
removing the peelable layer so that in the first area the polymer layer is also removed, to form a polymer-free area on the substrate; and
mounting a diode-protective cap on the polymer-free area of the substrate so that the diode-protective cap is hermetically sealed to the substrate.

24. A method for producing a polymer-free area on a substrate, comprising:
forming a first layer on a substrate, wherein the first layer includes a peelable material;
forming a second layer such that a first portion of the second layer is over the first layer, a second portion of the second layer is not over the first layer and the second layer includes a polymer material;
removing the first layer and the first portion of the second layer from the substrate, leaving the second portion of the second layer on the substrate, wherein the removing forms a polymer-free area on the substrate; and
mounting a diode-protective cap on the polymer-free area of the substrate so that the diode-protective cap is hermetically sealed to the substrate.

25. A method for producing a polymer-free area on a substrate, comprising:
forming a first layer on a substrate, wherein the first layer includes a polymer material;
forming a second layer over the first layer so that a first portion of first layer is covered by the second layer, a second portion of the first layer is not covered by the first layer, and the second layer includes a peelable material that bonds to the first layer;
removing the second layer, wherein removing the second layer removes the first portion of the first layer that is bonded to the second layer leaving the second portion, wherein the removing forms a polymer-free area on the substrate; and
mounting a diode-protective cap on the polymer-free area of the substrate so that the diode-protective cap is hermetically sealed to the substrate.

* * * * *